United States Patent
Tsugawa et al.

(10) Patent No.: US 11,570,890 B2
(45) Date of Patent: Jan. 31, 2023

(54) CERAMIC CIRCUIT BOARD AND MODULE USING SAME

(71) Applicant: DENKA COMPANY LIMITED, Tokyo (JP)

(72) Inventors: Yuta Tsugawa, Omuta (JP); Kouji Nishimura, Omuta (JP); Yusaku Harada, Omuta (JP); Ryota Aono, Omuta (JP); Shoji Iwakiri, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 312 days.

(21) Appl. No.: 16/616,902

(22) PCT Filed: May 29, 2018

(86) PCT No.: PCT/JP2018/020490
§ 371 (c)(1),
(2) Date: Nov. 25, 2019

(87) PCT Pub. No.: WO2018/221493
PCT Pub. Date: Dec. 6, 2018

(65) Prior Publication Data
US 2021/0176860 A1    Jun. 10, 2021

(30) Foreign Application Priority Data
May 30, 2017   (JP) .............................. JP2017-106505

(51) Int. Cl.
*B23K 35/30* (2006.01)
*C04B 37/02* (2006.01)
(Continued)

(52) U.S. Cl.
CPC ....... *H05K 1/0306* (2013.01); *B23K 35/3006* (2013.01); *C04B 37/023* (2013.01);
(Continued)

(58) Field of Classification Search
None
See application file for complete search history.

(56) References Cited

U.S. PATENT DOCUMENTS

| 5,807,626 A | 9/1998 | Naba | |
|---|---|---|---|
| 2014/0291699 A1* | 10/2014 | Yano | H01L 23/3735 257/77 |
| 2015/0313011 A1* | 10/2015 | Terasaki | H05K 3/388 428/336 |

FOREIGN PATENT DOCUMENTS

| EP | 3 492 441 A1 | 6/2019 |
|---|---|---|
| JP | H07-126079 A | 5/1995 |

(Continued)

OTHER PUBLICATIONS

Aug. 7, 2018 International Search Report issued in International Patent Application No. PCT/JP2018/020490.
(Continued)

*Primary Examiner* — Seth Dumbris
(74) *Attorney, Agent, or Firm* — Oliff PLC

(57) ABSTRACT

A ceramic circuit substrate having high bonding performance and excellent thermal cycling resistance properties, wherein a ceramic substrate and a copper plate are bonded by a braze material containing Ag and Cu, at least one active metal component selected from Ti and Zr, and at least one element selected from among In, Zn, Cd, and Sn, wherein a braze material layer, after bonding, has a continuity ratio of 80% or higher and a Vickers hardness of 60 to 85 Hv.

13 Claims, 1 Drawing Sheet

(51) Int. Cl.
*H05K 1/03* (2006.01)
*C22C 5/08* (2006.01)
*B23K 101/42* (2006.01)
*B23K 1/00* (2006.01)

(52) U.S. Cl.
CPC .............. *C22C 5/08* (2013.01); *B23K 1/0016* (2013.01); *B23K 2101/42* (2018.08); *C04B 2237/125* (2013.01); *C04B 2237/366* (2013.01); *C04B 2237/368* (2013.01); *C04B 2237/407* (2013.01); *C04B 2237/706* (2013.01); *Y10T 428/12875* (2015.01)

(56) References Cited

FOREIGN PATENT DOCUMENTS

| | | |
|---|---|---|
| JP | H08-310876 A | 11/1996 |
| JP | H09-36540 A | 2/1997 |
| JP | H09-132473 A | 5/1997 |
| JP | 2005-100884 A | 4/2005 |
| JP | 2009-170930 A | 7/2009 |
| JP | 2014-090144 A | 5/2014 |
| JP | 2016-169111 A | 9/2016 |
| JP | 2016-174165 A | 9/2016 |
| WO | 2018/021472 A1 | 2/2018 |

OTHER PUBLICATIONS

Apr. 21, 2020 Extended Search Report issued in European Patent Application No. 18809163.1.

* cited by examiner

CERAMIC CIRCUIT BOARD AND MODULE USING SAME

TECHNICAL FIELD

The present invention relates to a ceramic circuit substrate and a module using the same.

As substrates for circuits for use in power modules and the like, ceramic substrates composed of ceramics such as alumina, beryllia, silicon nitride, and aluminum nitride are used in view of the thermal conductivity, cost, safety, and the like. These ceramic substrates are used as circuit substrates by bonding metal circuit boards and heat dissipation plates composed of copper, aluminum, and the like thereto. These have excellent insulating properties, heat dissipation properties, and the like relative to resin substrates or metal substrates having resin layers as insulating materials. Thus, they are used as substrates for mounting high-heat-dissipation electronic components.

In power module applications such as elevators, vehicles, and hybrid cars, it is common to use ceramic circuit substrates in which a metal circuit board is bonded, with a braze material, to the surface of a ceramic substrate, and semiconductor elements are further mounted at prescribed positions on the metal circuit board. In recent years, in order to deal with the increased amounts of heat generated by semiconductor elements due to the higher integration, higher frequencies, and higher output power of semiconductor elements, ceramic substrates composed of aluminum nitride sintered bodies or silicon nitride sintered bodies, which have high thermal conductivity, are being used. In particular, aluminum nitride substrates have high thermal conductivity in comparison to silicon nitride substrates, and are thus favorable for use as ceramic substrates for mounting high-heat-dissipation electronic components.

However, although aluminum nitride substrates have high thermal conductivity, they have low mechanical strength, toughness, and the like. Thus, they have the difficulty that cracks may be formed by being tightly clamped during the assembly process, or cracks can easily form when they are subjected to thermal cycling. In particular, when used in power modules that are used with severe loads and thermal conditions, such as automobiles, electric railways, industrial machine tools, and robots, this difficulty is becoming especially significant.

For this reason, in ceramic substrates for mounting electronic components, improved mechanical reliability is sought, and there has been increasing interest in silicon nitride substrates, which have inferior thermal conductivity in comparison to aluminum nitride substrates, but which have superior mechanical strength and toughness.

Ceramic circuit substrates using silicon nitride substrates are produced, for example, by the active metal brazing method indicated below.

The active metal brazing method is a method of bonding a metal plate onto a ceramic substrate by means of a braze material layer containing an active metal such as a Group IVA element or a Group VA element, and generally involves screen printing a braze material containing Ag, Cu, and Ti onto both main surfaces of a silicon nitride substrate, arranging a metal circuit board and a metal heat dissipation plate on the printed surfaces, and bonding the metal plates to the ceramic substrate by heating at an appropriate temperature.

In a ceramic circuit substrate obtained in this way, the active metal, Ti, covalently bonds with the N in the nitride ceramic substrate, thereby forming TiN (titanium nitride). This TiN forms a bonding layer, thus resulting in bonding strength that is high to a certain degree.

However, in vehicle-mounted power modules, higher heat dissipation properties are needed, and the possibility of thinning the ceramic substrate and thickening the metal plate has been considered. However, with such a structure, the stress load during thermal cycling, which is due to the thermal expansion coefficient difference between the ceramic substrate and the metal plate, becomes even greater, as a result of which cracks form in the ceramic substrate and cause insulation failures, the metal plate peels, leading to thermal conduction failures, and the operational reliability as an electronic device is reduced. For these reasons, the proposals indicated below have been made regarding the compositions of braze materials in ceramic circuit substrates capable of withstanding thermal stress.

In Patent Document 1, it is described that the Vickers hardness is increased in a reaction-generated layer, which is composed of TiN or (Ti, Cu, In, Al)N generated by inducing a reaction between a braze material layer and an aluminum nitride substrate by adding 5% or more of In to the braze material layer, which contains Ag, Cu, and Ti. Furthermore, it is described that the thermal cycling resistance of the ceramic circuit substrate increases in proportion to the increase in the Vickers hardness of the reaction-generated layer.

However, according to this method, although the bonding strength of the ceramic substrate interface increases, as the amount of In that is added becomes greater, the continuity of the braze material layer, containing Ag as the main component, decreases and the Vickers hardness also increases. When the continuity of the braze material layer is reduced while the Vickers hardness increases, the shock absorption function for mitigating thermal stress caused by the thermal expansion coefficient difference occurring at the bonding interface between the ceramic substrate and the metal plate is reduced, and for example, it was not possible to satisfy the thermal cycling resistance properties that are required in ceramic circuit substrates in which thick copper plates having a thickness of 0.8 mm are bonded.

CITATION LIST

Patent Literature

Patent Document 1: JP H9-36540 A

SUMMARY OF INVENTION

TECHNICAL PROBLEM

In consideration of the above-described problem, an objective of the present invention is to obtain a ceramic circuit substrate having high bonding performance and excellent thermal cycling resistance.

SOLUTION TO PROBLEM

In order to achieve the above-described objective, the present inventors adjusted ceramic circuit substrates by variously changing the amounts of chemical elements and the fill ratios of raw material powders contained in the braze material for bonding the ceramic substrate with the metal circuit board, and performed a comparison study of the effects that the amounts of chemical elements and the fill ratios of raw material powders contained in the braze material have on the thermal cycling resistance properties of circuit substrates. As a result thereof, it was discovered that the thermal cycling resistance properties of circuit substrates are improved by increasing the continuity of the braze material layer and lowering the Vickers hardness. The present invention was completed on the basis of these discoveries.

In other words, the present invention is a ceramic circuit substrate wherein a ceramic substrate and a copper plate are bonded by a braze material containing Ag and Cu, at least one active metal component selected from Ti and Zr, and at least one element selected from among In, Zn, Cd, and Sn, wherein a braze material layer, after bonding, has a continuity ratio of 80% or higher and a Vickers hardness of 60 to 85 Hv.

Advantageous Effects of Invention

According to the present invention, a ceramic circuit substrate having high bonding performance and excellent thermal cycling resistance can be provided. More specifically, it is possible to provide a ceramic circuit substrate in which the continuity ratio of the braze material layer after bonding is 80% or higher and the Vickers hardness of the braze material layer is 60 to 85 Hv, and furthermore, the crack ratio after 2000 cycles in heat cycling tests from −55° C. to 150° C. is less than 1%.

REFERENCE SIGNS LIST

Figure 1:
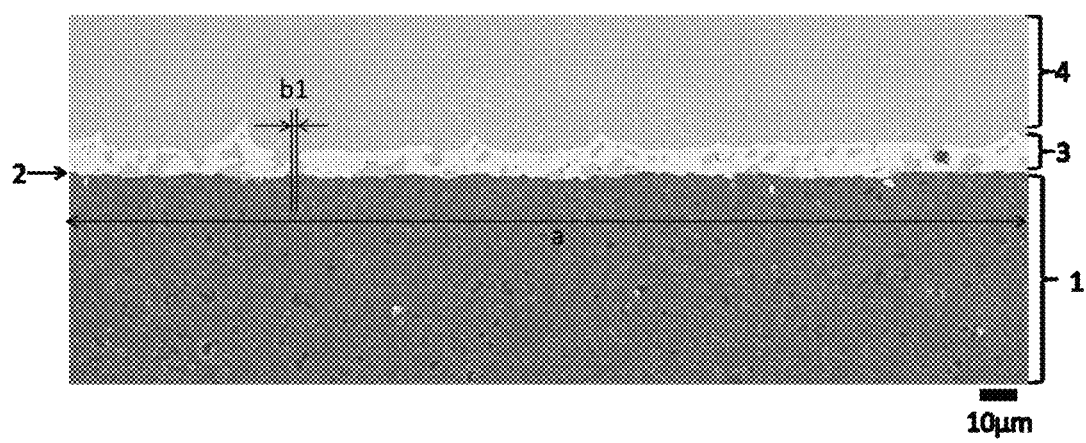
FIG. 1 shows an example of a photograph of a cross-section of a ceramic circuit substrate in which the continuity ratio of the braze material layer is 99.5%
Figure 2:
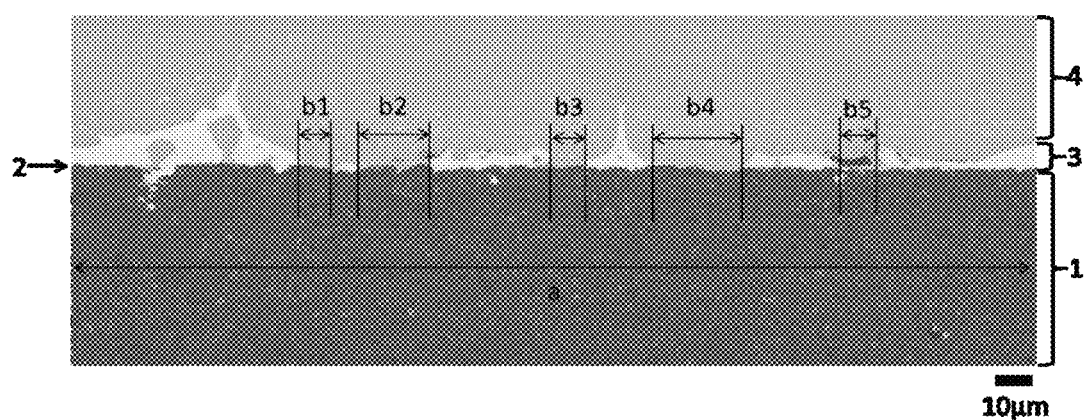
FIG. 2 shows an example of a photograph of a cross-section of a ceramic circuit substrate in which the continuity ratio of the braze material layer is 72.9%

1 Ceramic substrate
2 Ceramic circuit substrate bonding interface (TiN bonding layer)
3 Braze material layer
4 Copper plate
a Overall length
b Discontinuous length of braze material

DESCRIPTION OF EMBODIMENTS

[Ceramic Circuit Substrate]

The ceramic circuit substrate of the present invention is a ceramic circuit substrate wherein a ceramic substrate and a copper plate are bonded by a braze material containing Ag and Cu, at least one active metal component selected from Ti and Zr, and at least one element selected from among In, Zn, Cd, and Sn, wherein a braze material layer, after bonding, has a continuity ratio of 80% or higher and a Vickers hardness of 60 to 85 Hv.

The ceramic substrate that is used in the ceramic circuit substrate of the present invention is not particularly limited, and it is possible to use a nitride ceramic such as silicon nitride or aluminum nitride, an oxide ceramic such as aluminum oxide or zirconium oxide, a carbide ceramic such as silicon carbide, or a boride ceramic such as lanthanum boride. However, a non-oxide ceramic such as aluminum nitride or silicon nitride is favorable for bonding a metal plate to a ceramic substrate by an active metal brazing method.

In one embodiment of the present invention, the thickness of the ceramic substrate is not particularly limited, but is generally about 0.1 to 3.0 mm. In particular, considering the decrease in the thermal resistance of the circuit substrate overall, it should preferably be 1.0 mm or less, and more preferably 0.4 mm or less.

In one embodiment of the present invention, the purity of the copper plate is preferably 90% or higher. By setting the purity to be 90% or higher, the reaction between the copper plate and the braze material can be kept from being insufficient when bonding the ceramic substrate to the copper plate, and the copper plate can be kept from being hard and thereby lowering the reliability of the circuit substrate.

In one embodiment of the present invention, the thickness of the copper plate is not particularly limited, but is generally about 0.1 to 2.0 mm. In particular, in view of the heat dissipation properties, it should preferably be 0.3 mm or more, and more preferably 0.5 mm or more.

The present inventors performed diligent investigations towards achieving excellent thermal cycling resistance even in ceramic circuit substrates comprising a thin ceramic substrate and a thick metal plate for the purpose of improving the heat dissipation properties, whereupon they discovered that the thermal cycling resistance properties are improved by increasing the continuity ratio of the braze material layer and lowering the Vickers hardness. Furthermore, it was found that the continuity ratio of the braze material layer can be increased by raising the fill ratio of an Ag powder that is the main component of the braze material, and that the Vickers hardness of the braze material layer can be lowered by reducing the added amounts of active metals and chemical elements such as Sn contained in the braze material.

In the ceramic circuit substrate of the present invention, the continuity ratio of the braze material layer after bonding is 80% or higher. In this case, the continuity ratio of the braze material layer refers to the continuity of the alloy containing Ag as the main component. The continuity ratio of the braze material layer is determined by adjusting the cross-sections of fabricated ceramic circuit substrates, and randomly observing and measuring three locations in fields of view at 500-times magnification under a scanning electron microscope. The continuity ratio is the average value of the values measured in the three fields of view. In the structure of the braze material layer, alloys containing Ag as the main component and other alloys have different detection intensities and thus different contrasts, so the thicknesses and proportions thereof can be observed. The continuity ratio of the braze material layer was determined, in accordance with Expression (I) below, by measuring the length (discontinuous length of the braze material) over which the thickness of the alloy containing Ag as the main component is 1 µm or less in a field of view at 500-times magnification, and dividing the difference between that length and the overall length by the overall length.

$$\text{Continuity ratio of braze material layer (\%)} = (\text{Overall length} - \text{discontinuous length of braze material}) / \text{Overall length} \times 100 \quad \text{(I)}$$

The continuity ratio of the braze material layer is preferably 80% or higher, and more preferably 90% or higher in view of the thermal cycling resistance. When the continuity ratio is less than 80%, the thermal stress tends to be locally concentrated, and the thermal cycling resistance tends to be reduced.

In the ceramic circuit substrate of the present invention, the Vickers hardness of the braze material layer is 60 to 85

Hv. By adjusting the cross-sections of ceramic fabricated circuit substrates, and using an indenter to press, with a 0.025-kgf load, a location at a distance of 33 μm in the vertical direction from the bonding interface of the ceramic circuit substrate towards the copper plate, the Vickers hardness can be computed from the area of the dent created. The Vickers hardness of the braze material layer is preferably 65 to 85 Hv, and more preferably 65 to 75 Hv. By setting the Vickers hardness of the braze material layer to be 85 Hv or lower, the shock absorption effect of the braze material layer can be kept from being reduced and the thermal cycling resistance can be kept from being reduced.

Additionally, in one embodiment of the present invention, the bonding void ratio in the ceramic circuit substrate is preferably 1.0% or lower, more preferably 0.5% or lower, and even more preferably 0.2% or lower.

Furthermore, in the ceramic circuit substrate according to one embodiment of the present invention, the crack ratio after repeating 2000 cycles in heat cycling resistance tests wherein each cycle involves setting the temperature to −55° C. for 15 minutes, then setting the temperature to 150° C. for 15 minutes, is preferably lower than 1.0%, more preferably lower than 0.8%, and even more preferably lower than 0.2%.

In one embodiment of the present invention, a braze material containing Ag, Cu and an active metal is used to bond the ceramic circuit substrate. The compositional ratio between the Ag and the Cu is preferably set to a compositional ratio in which a eutectic composition is readily formed, and in particular, a composition that takes into account the fact that Cu from the copper circuit board and the copper heat dissipation plate will be melted in. In 100 parts by mass, in total, of the Ag powder and the Cu powder, it is preferable for the Ag powder to occupy 75 to 100 parts by mass and for the Cu powder to occupy 0 to 25 parts by mass, more preferably 75 to 99 parts by mass, and even more preferably 80 to 95 parts by mass. By setting the amount of the Ag powder to be 75 to 100 parts by mass, the melting temperature of the braze material can be kept from rising, the thermal stress caused by the thermal expansion coefficient difference at the time of bonding can be kept from increasing, and the thermal cycling resistance can be kept from being reduced.

As the active metal, at least one type is selected from among titanium, zirconium, hafnium, niobium, and the like. The amount of the active metal contained in the braze material of the present invention is preferably 0.5 to 6.0 parts by mass, more preferably 1 to 5 parts by mass, and even more preferably 2 to 4 parts by mass relative to 100 parts by mass, in total, of the Ag powder and the Cu powder. By setting the active metal content to be 0.5 parts by mass or higher, the wettability between the ceramic substrate and the braze material can be kept from being poor, and the tendency for bonding defects to occur can be suppressed. On the other hand, by setting the active metal content to be 6.0 parts by mass or less, a brittle active metal nitride layer formed at the bonding interface can be kept from becoming overly large, and the thermal cycling resistance can be kept from being lowered. The active metal is preferably Ti or Zr.

The braze material layer in the present invention may contain at least one chemical element selected from among In, Zn, Cd, and Sn. The amount contained in the braze material layer is preferably 0.4 to 5 parts by mass, more preferably 0.4 to 5 parts by mass, and even more preferably 1 to 4 parts by mass relative to 100 parts by mass, in total, of the Ag powder and the Cu powder. By setting the content to be 0.4 parts by mass or higher, the wettability between the ceramic substrate and the braze material can be kept from being poor, and the tendency for bonding defects to occur can be suppressed. On the other hand, by setting the content to be 5.0 parts by mass or less, the amount of an intermetallic compound of Cu and Sn that is generated can be kept from increasing and thus making the Vickers hardness higher, and the thermal cycling resistance properties can be kept from being reduced.

In one embodiment of the present invention, the tapped density of the Ag powder contained in the braze material is preferably 3 g/cm$^3$ or higher. The tapped density was computed by means of a tapped density measuring device in accordance with the JIS Z 2512 standard. By setting the tapped density to be 3 g/cm$^3$ or higher, the contact area between braze material metal powders can be kept from being reduced, the dispersion state can be kept from becoming non-uniform, the dispersion of the braze material at the time of bonding can be kept from becoming non-uniform, and the continuity ratio of the braze material layer can be kept from being reduced, thereby keeping the thermal cycling resistance from being reduced.

In one embodiment of the present invention, the thickness of the braze material is preferably 5 to 40 μm by a dry standard. By setting the braze material thickness to be 5 μm or more, unreacted portions can be kept from being formed. On the other hand, by setting the braze material thickness to be 40 μm or less, the time required for removing the bonding layer can be kept from being too long and the productivity can be kept from being reduced. The coating method is not particularly limited, and a generally known coating method by which the substrate surface can be uniformly coated, such as screen printing or roller coating, may be employed.

[Method for Producing Ceramic Circuit Substrate]

The method for producing the ceramic circuit substrate of the present invention involves bonding in a vacuum of $1.0 \times 10^{-3}$ Pa or lower, at a bonding temperature of 700 to 820° C. and for a retention time of 10 to 60 minutes, using a braze material containing 75 to 99 parts by mass of Ag, 1 to 25 parts by mass of Cu, 0.5 to 6 parts by mass of at least one type of active metal component selected from Ti and Zr, and 0.4 to 5 parts by mass of at least one element selected from among In, Zn, Cd, and Sn, wherein the tapped density of Ag powder grains used in the braze material is 3 g/cm$^3$ or higher. In one embodiment of the present invention, the bonding between the ceramic substrate and the metal plate preferably involves bonding in a vacuum at a temperature of 700 to 820° C. and for a time of 10 to 60 minutes. The bonding temperature is more preferably 720 to 810° C., and even more preferably 740 to 800° C. The retention time is more preferably 20 to 60 minutes, and even more preferably 30 to 50 minutes. By setting the bonding temperature to be 700° C. or higher and the retention time to be 10 minutes or longer, the generation of Ti and Zr compounds can be kept from being insufficient and thus preventing bonding in some portions. On the other hand, by setting the bonding temperature to be 820° C. or lower and the retention time to be 60 minutes or shorter, thermal stress caused by the thermal expansion coefficient difference at the time of bonding can be kept from increasing, and the thermal cycling resistance can be kept from being reduced.

In one embodiment of the present invention, the metal plate is coated with an etching resist and etched in order to form a circuit pattern on the circuit substrate. There are no particular restrictions regarding the etching resist, and for example, a commonly used UV-cured type or a thermally cured type may be used. There are no particular restrictions on the etching resist coating method, and for example, a generally known coating method such as screen printing may be employed.

In one embodiment of the present invention, the copper plate is etched in order to form a circuit pattern. There are no particular restrictions on the etching solution, and it is possible to use a commonly used ferric chloride solution or cupric chloride solution, sulfuric acid, hydrogen peroxide water, or the like, among which a ferric chloride solution or a cupric chloride solution is preferred. A nitride ceramic circuit substrate from which unnecessary metal portions have been removed by etching has the coated braze material, and alloy layers, nitride layers, and the like thereof still remaining, and it is common to remove these by using a solution containing an aqueous ammonium halide solution, an inorganic acid such as sulfuric acid or nitric acid, or hydrogen peroxide water. After the circuit is formed, the etching resist is stripped. The stripping method is not particularly limited, and a method of immersion in an alkaline aqueous solution is common.

EXAMPLES

Hereinafter, the present invention will be explained in detail by referring to examples. However, the scope of the present invention is not limited to the examples below.

Example 1

An active metal braze material containing 3.5 parts by mass of a $TiH_2$ powder (TSH-350, manufactured by Osaka Titanium Technologies Co., Ltd.) and 3 parts by mass of an Sn powder (Sn-HPN 3 μm, manufactured by Fukuda Metal Foil & Powder Co., Ltd.) with respect to 100 parts by mass, in total, of 90 parts by mass of an Ag powder (Ag-HWQ 2.5 μm, manufactured by Fukuda Metal Foil & Powder Co., Ltd.) and 10 parts by mass of a Cu powder (Cu-HWQ 3 μm, manufactured by Fukuda Metal Foil & Powder Co., Ltd.), was coated onto a 0.32 mm-thick silicon nitride substrate. An oxygen-free copper plate having a thickness of 0.8 mm was bonded onto a circuit surface and one having a thickness of 0.8 mm was bonded onto a rear surface, at 800° C. and for 30 minutes in a vacuum of $1.0 \times 10^{-3}$ Pa or lower.

A UV-curable etching resist was printed by screen printing, in a circuit pattern, onto the bonded circuit substrate, and after UV-curing, a heat dissipation surface shape was printed and UV-cured. This was etched by using an aqueous cupric chloride solution as the etchant, and subsequently treated, as needed, with a 60° C. aqueous ammonium thiosulfate solution and an aqueous ammonium fluoride solution, thereby forming a circuit pattern and a heat dissipation plate pattern.

The bonding performance and the thermal cycling resistance of the ceramic circuit substrate were evaluated by the below-indicated methods.

<Evaluation of Bonding Performance>

After measuring a bonded circuit substrate with an ultrasonic flaw detector (FS-Line manufactured by Hitachi Power Solutions Co., Ltd.), the area occupied by bonding voids within the area of the circuit was measured.

<Evaluation of Thermal Cycling Resistance>

A fabricated silicon nitride circuit substrate was repeatedly tested over 2000 cycles in heat cycling resistance tests wherein each cycle involved setting the temperature to −55° C. for 15 minutes, then 150° C. for 15 minutes. Thereafter, the copper plate and the braze material layer were stripped with a copper chloride solution and an ammonium fluoride/hydrogen peroxide etching solution, and after using the image analysis software GIMP2 (threshold value 140) to digitize and compute the areas of horizontal cracks on the silicon nitride substrate surface, the crack ratio was computed by determining the horizontal crack area divided by the area of the circuit pattern.

<Overall Judgment Criteria>

Those in which the bonding void ratio was 1.0% or lower and the crack ratio was lower than 0.2% were graded A, those in which the bonding void ratio was 1.0% or lower and the crack ratio was 1.0% or lower were graded B, and those in which the bonding void ratio was higher than 1.0% or the crack ratio was higher than 1.0% were graded C.

Examples 2 to 10 and Comparative Examples 1 to 7

The same procedure as in Example 1 was performed, except that the conditions shown in Table 1 were used. The evaluation results are shown in Table 2.

TABLE 1

| | Ceramic Substrate Material | Braze Material Metal Composition (parts by mass) | | | | | Ag Powder Tapped Density (g/cm³) | Bonding Conditions | | |
|---|---|---|---|---|---|---|---|---|---|---|
| | | Ag | Cu | Ti | Zr | Other | | Bonding Temp (° C.) | Retention Time (min) | Vacuum Degree (Pa) |
| Example 1 | silicon nitride | 90 | 10 | 3.5 | 0 | Sn 3 | 3.5 | 800 | 30 | $1.0 \times 10^{-3}$ |
| Example 2 | silicon nitride | 75 | 25 | 3.5 | 0 | Sn 3 | 3.5 | 820 | 30 | $1.0 \times 10^{-3}$ |
| Example 3 | silicon nitride | 90 | 10 | 3.5 | 0 | Sn 0.5 | 3.5 | 800 | 30 | $1.0 \times 10^{-3}$ |
| Example 4 | silicon nitride | 90 | 10 | 3.5 | 0 | In 3 | 3.5 | 800 | 30 | $1.0 \times 10^{-3}$ |
| Example 5 | silicon nitride | 90 | 10 | 3.5 | 0 | Sn 3 | 3.0 | 800 | 30 | $1.0 \times 10^{-3}$ |
| Example 6 | silicon nitride | 90 | 10 | 2.4 | 1.1 | Sn 3 | 3.5 | 820 | 30 | $1.0 \times 10^{-3}$ |
| Example 7 | aluminum nitride | 90 | 10 | 3.5 | 0 | Sn 3 | 3.5 | 800 | 30 | $1.0 \times 10^{-3}$ |
| Example 8 | silicon nitride | 90 | 10 | 2.4 | 0 | Sn 3 | 3.5 | 820 | 30 | $1.0 \times 10^{-3}$ |
| Example 9 | silicon nitride | 90 | 10 | 3.5 | 0 | Sn 5 | 3.5 | 740 | 30 | $1.0 \times 10^{-3}$ |
| Example 10 | silicon nitride | 90 | 10 | 3.5 | 0 | Sn 3 | 4.5 | 800 | 30 | $1.0 \times 10^{-3}$ |
| Comparative Example 1 | silicon nitride | 90 | 10 | 7 | 0 | Sn 3 | 3.5 | 800 | 30 | $1.0 \times 10^{-3}$ |
| Comparative Example 2 | silicon nitride | 90 | 10 | 3.5 | 0 | Sn 6 | 3.5 | 740 | 30 | $1.0 \times 10^{-3}$ |
| Comparative Example 3 | silicon nitride | 90 | 10 | 3.5 | 0 | Sn 3 | 2.0 | 800 | 30 | $1.0 \times 10^{-3}$ |

TABLE 1-continued

| | Ceramic Substrate Material | Braze Material Metal Composition (parts by mass) | | | | | Ag Powder Tapped Density (g/cm³) | Bonding Conditions | | |
|---|---|---|---|---|---|---|---|---|---|---|
| | | Ag | Cu | Ti | Zr | Other | | Bonding Temp (° C.) | Retention Time (min) | Vacuum Degree (Pa) |
| Comparative Example 4 | silicon nitride | 90 | 10 | 3.5 | 0 | Sn 3 | 2.0 | 830 | 30 | 1.0 × 10⁻³ |
| Comparative Example 5 | silicon nitride | 90 | 10 | 3.5 | 0 | 0 | 3.5 | 860 | 30 | 1.0 × 10⁻³ |
| Comparative Example 6 | silicon nitride | 90 | 10 | 0.3 | 0 | Sn 3 | 3.5 | 820 | 30 | 1.0 × 10⁻³ |
| Comparative Example 7 | silicon nitride | 90 | 10 | 3.5 | 0 | Sn 3 | 3.5 | 840 | 10 | 1.0 × 10⁻³ |

TABLE 2

| | Ceramic Circuit Substrate | | | | |
|---|---|---|---|---|---|
| | | | Evaluation | | |
| | Braze Material Layer Continuity Ratio (%) | Braze Material Layer Vickers Hardness (Hv) | Bonding Void Ratio (%) | Crack Ratio (%) | Overall Grade |
| Example 1 | 94 | 74 | 0.1 | 0.1 | A |
| Example 2 | 87 | 76 | 0.1 | 0.4 | B |
| Example 3 | 100 | 72 | 0.6 | 0.1 | A |
| Example 4 | 90 | 82 | 0.1 | 0.6 | B |
| Example 5 | 90 | 74 | 0.3 | 0.2 | A |
| Example 6 | 91 | 80 | 0.0 | 0.5 | B |
| Example 7 | 92 | 74 | 0.0 | 0.8 | B |
| Example 8 | 88 | 72 | 0.7 | 0.3 | B |
| Example 9 | 87 | 82 | 0.0 | 0.8 | B |
| Example 10 | 93 | 74 | 0.0 | 0.1 | B |
| Comparative Example 1 | 91 | 98 | 0.0 | 1.6 | C |
| Comparative Example 2 | 87 | 90 | 0.0 | 2.8 | C |
| Comparative Example 3 | 75 | 78 | 1.2 | 2.2 | C |
| Comparative Example 4 | 79 | 86 | 0.5 | 3.8 | C |
| Comparative Example 5 | 88 | 90 | 2.6 | 1.5 | C |
| Comparative Example 6 | 73 | 75 | 5.4 | 1.3 | C |
| Comparative Example 7 | 84 | 88 | 0.0 | 2.5 | C |

As shown in Table 2, it was confirmed that, in ceramic circuit substrates produced by using an Ag powder having a tapped density of 3 g/cm³ or higher, in which the added amount of In or Sn was 5 parts by mass or less and the bonding temperature was 820° C. or lower, the Vickers hardness of the braze material layer was within the range from 60 to 85 Hv and the horizontal crack generation rate after thermal cycling tests was less than 1%. It was confirmed that, in circuit substrates fabricated by adding 3 parts by mass or less of Sn and at a bonding temperature of 800° C. or lower, the Vickers hardness was within the range from 60 to 75 Hv, the continuity ratio of the braze material layer was 90% or higher, and the horizontal crack generation rate after thermal cycling tests was less than 0.2%.

On the other hand, it was confirmed that, when more than 5 parts by mass of Sn was added or the bonding temperature was higher than 820° C., the Vickers hardness of the braze material was higher than 85 Hv, and the horizontal crack generation rate after thermal cycling resistance tests was 1% or higher. Additionally, it was confirmed that, when a braze material powder that was an Ag powder having a tapped density of less than 3 g/cm³ was used, and a copper plate and a ceramic substrate were bonded at 820° C. or lower, the bonding was insufficient. It was confirmed that, when the bonding was performed at a temperature higher than 820° C., the bonding performance was improved, but the Vickers hardness of the braze material layer was higher than 85 Hv and the continuity ratio was less than 80%, thereby reducing the thermal cycling resistance.

The invention claimed is:

1. A ceramic circuit substrate, which has a crack ratio after repeating 2000 cycles in heat cycling resistance tests wherein each cycle involves setting the temperature to −55° C. for 15 minutes, then setting the temperature to 150° C. for 15 minutes, is lower than 1.0%, wherein a ceramic substrate and a copper plate are bonded by a braze material containing Ag and Cu, at least one active metal component selected from Ti and Zr, and at least one element selected from among In, Zn, Cd, and Sn, wherein a braze material layer, after bonding, has a continuity ratio of 80% or higher and a Vickers hardness of 60 to 85 Hv,
the braze material contains 75 to 99 parts by mass of Ag, 1 to 25 parts by mass of Cu, 0.5 to 6 parts by mass of the at least one active metal, and 0.4 to 5 parts by mass of the at least one element.

2. The ceramic circuit substrate according to claim 1, wherein the ceramic substrate is an aluminum nitride substrate or a silicon nitride substrate.

3. The ceramic circuit substrate according to claim 1, wherein the copper plate has a thickness of 0.2 to 2.0 mm.

4. A method for producing the ceramic circuit substrate according to claim 1, wherein a braze material, which contains 75 to 99 parts by mass of Ag, 1 to 25 parts by mass of Cu, 0.5 to 6 parts by mass of at least one active metal component selected from Ti and Zr, and 0.4 to 5 parts by mass of at least one element selected from among In, Zn, Cd, and Sn, is used for bonding in a vacuum of $1.0 \times 10^{-3}$ Pa or lower, at a bonding temperature of 700° C. to 820° C., and for a retention time of 10 to 60 minutes, and Ag powder grains used in the braze material have a tapped density of 3 g/cm$^3$ or higher.

5. The ceramic circuit substrate according to claim 2, wherein the copper plate has a thickness of 0.2 to 2.0 mm.

6. The ceramic circuit substrate according to claim 1, wherein the continuity ratio is 90% or higher.

7. The ceramic circuit substrate according to claim 1, wherein the Vickers hardness is 65 to 85 Hv.

8. The ceramic circuit substrate according to claim 1, wherein the Vickers hardness is 65 to 75 Hv.

9. The ceramic circuit substrate according to claim 1, which has a bonding void ratio of 1.0% or lower.

10. The ceramic circuit substrate according to claim 9, wherein the bonding void ratio is 0.5% or lower.

11. The ceramic circuit substrate according to claim 9, wherein the bonding void ratio is 0.2% or lower.

12. The ceramic circuit substrate according to claim 1, wherein the crack ratio is lower than 0.8%.

13. The ceramic circuit substrate according to claim 1, wherein the crack ratio is lower than 0.2%.

* * * * *